(12) United States Patent
Ali et al.

(10) Patent No.: US 12,269,092 B2
(45) Date of Patent: Apr. 8, 2025

(54) APPARATUS AND METHOD FOR FORMING A THREE-DIMENSIONAL ARTICLE

(71) Applicant: Arcam AB, Mölnlycke (SE)

(72) Inventors: Safdar Ali, Gothenburg (SE); Kristofer Karlsson, Kungsbacka (SE)

(73) Assignee: Arcam AB, Mölnlycke (SE)

( * ) Notice: Subject to any disclaimer, the term of this patent is extended or adjusted under 35 U.S.C. 154(b) by 837 days.

(21) Appl. No.: 17/296,590

(22) PCT Filed: Mar. 1, 2019

(86) PCT No.: PCT/EP2019/055155
§ 371 (c)(1),
(2) Date: May 25, 2021

(87) PCT Pub. No.: WO2020/108801
PCT Pub. Date: Jun. 4, 2020

(65) Prior Publication Data
US 2022/0001452 A1    Jan. 6, 2022

(51) Int. Cl.
*B22F 10/85* (2021.01)
*B22F 10/28* (2021.01)
(Continued)

(52) U.S. Cl.
CPC .............. *B22F 10/85* (2021.01); *B22F 10/28* (2021.01); *B22F 10/368* (2021.01); *B22F 12/41* (2021.01);
(Continued)

(58) Field of Classification Search
CPC .......... B33Y 10/00; B33Y 30/00; B33Y 40/00; B33Y 50/02; B22F 10/28; B22F 10/85;
(Continued)

(56) References Cited

U.S. PATENT DOCUMENTS

| 4,929,838 A | * | 5/1990 | Yasuda | ................... | B82Y 40/00 |
| | | | | | 250/398 |
| 5,185,530 A | * | 2/1993 | Norioka | ................... | H01J 37/09 |
| | | | | | 250/398 |

(Continued)

OTHER PUBLICATIONS

International Search Report and Written Opinion for application PCT/EP2019/055155 mail date Aug. 6, 2019 (19 pages).

*Primary Examiner* — David E Smith
(74) *Attorney, Agent, or Firm* — Dinsmore & Shohl LLP

(57) ABSTRACT

An apparatus for forming a three-dimensional article through successively depositing individual layers of powder material that are fused together with an electron beam from an electron beam source so as to form the article according to a computer model thereof. The apparatus includes a chamber a chamber having a first section and a second section openly connected to each other. The first section is configured to receive the individual layers of powder material. The second section comprising an electron beam source, an electromagnetic focus coil having an axially extending, and a reflector coil. The electron beam source is configured to emit an electron beam to fuse the individual layers of powder material. The reflector coil is arranged radially outside the electromagnetic focus coil. The direction of windings of the reflector coil is opposite a direction of windings of the electromagnetic focus coil.

20 Claims, 10 Drawing Sheets

(51) Int. Cl.
*B22F 10/368* (2021.01)
*B22F 12/41* (2021.01)
*B22F 12/44* (2021.01)
*B33Y 10/00* (2015.01)
*H01J 37/09* (2006.01)
*H01J 37/21* (2006.01)
*H01J 37/305* (2006.01)
*B22F 12/00* (2021.01)
*B22F 12/49* (2021.01)
*B33Y 30/00* (2015.01)
*B33Y 50/02* (2015.01)

(52) U.S. Cl.
CPC .............. *B22F 12/44* (2021.01); *B33Y 10/00* (2014.12); *H01J 37/09* (2013.01); *H01J 37/21* (2013.01); *H01J 37/305* (2013.01); *B22F 12/38* (2021.01); *B22F 12/49* (2021.01); *B33Y 30/00* (2014.12); *B33Y 50/02* (2014.12); *H01J 2237/0266* (2013.01); *H01J 2237/3128* (2013.01)

(58) Field of Classification Search
CPC ........ B22F 10/368; B22F 12/41; B22F 12/44; B22F 12/38; B22F 12/39; H01J 37/09; H01J 37/21; H01J 37/305; H01J 2237/0266; H01J 2237/3128
See application file for complete search history.

(56) References Cited

U.S. PATENT DOCUMENTS

| | | | |
|---|---|---|---|
| 2002/0038852 A1* | 4/2002 | Suzuki | H01J 37/09 |
| | | | 250/396 ML |
| 2002/0121615 A1* | 9/2002 | Nakasuji | B82Y 40/00 |
| | | | 250/396 ML |
| 2005/0104013 A1 | 5/2005 | Stengl et al. | |
| 2008/0135755 A1* | 6/2008 | Suzuki | H01J 37/28 |
| | | | 250/310 |
| 2016/0311021 A1* | 10/2016 | Elfstroem | B33Y 50/02 |
| 2018/0239336 A1* | 8/2018 | Barr | H01J 37/305 |
| 2018/0339341 A1* | 11/2018 | Tatsumi | B22F 10/362 |
| 2020/0219697 A1* | 7/2020 | Hirano | H01J 37/09 |
| 2020/0247109 A1* | 8/2020 | Shimizu | B22F 10/50 |

* cited by examiner

APPARATUS AND METHOD FOR FORMING A THREE-DIMENSIONAL ARTICLE

CROSS REFERENCE TO RELATED APPLICATIONS

The present application is a National Phase Entry of International Application No. PCT/EP2019/055155 entitled "APPARATUS AND METHOD FOR FORMING A THREE-DIMENSIONAL ARTICLE" and filed on Mar. 1, 2019, which claims priority to U.S. Provisional Patent Application 62/773,285 filed on Nov. 30, 2018, both of which are incorporated by reference herein in their respective entireties.

BACKGROUND

Related Field

The present invention relates generally to the field of apparatus and methods for additive manufacturing of a three-dimensional article by successively fusing layer by layer of powder material by means of an electron beam, e.g. Electron Beam Melting (EBM) machines. Further, the present invention relates particularly to the field of electron beam control in additive manufacturing machines. The inventive apparatus for forming a three-dimensional article through successively depositing individual layers of powder material that are fused together with an electron beam from an electron beam source so as to form the article according to a computer model thereof, comprises a chamber having a first section and a second section openly connected to each other, the individual layers of powder material that are fused together are provided in the first section, the second section comprising the electron beam source and an electromagnetic focus coil having an axially extending central axis. The invention also relates to an associated method. The invention also relates to a coil arrangement suitable for such an apparatus.

Description of Related Art

Free-form fabrication or additive manufacturing is a method for forming three-dimensional articles through successive fusion of chosen parts of powder layers applied to a worktable.

Equipment for producing a three-dimensional object layer by layer using a powdery material which can be solidified by irradiating it with electromagnetic radiation or an electron beam are known from various patents. Such equipment include for instance a supply of powder, means for applying a layer of powder on a work table on which the three-dimensional article is to be formed, and means for directing the high energy beam or electron beam over the work area. The powder sinters or melts and solidifies as the electron beam is moved over the work area, whereupon the three-dimensional article is formed successively layer by layer.

In additive manufacturing a short manufacturing time and high quality of the finalized product is of outmost importance. The applicant produces machines for additive manufacturing providing short manufacturing times of three-dimensional articles having high quality, and during such and other additive manufacturing the electromagnetic focus coil or focusing lens is used to focus and defocus the electron beam on the work area. The electromagnetic focus coil is supplied with AC power. The desired material properties of the final article depend on the ability to control the electron beam. However, the rapid change of electric current through the electromagnetic focus coil will produce high frequency AC magnetic field. The generated magnetic flux may interact with the surrounding environment such as other electronic devices, neighboring EBM machines, metallic tools, etc., resulting in an incorrect electron beam position and thus a poor-quality three-dimensional article.

It is also a risk that the magnetic field from the electromagnetic focus coil may interact with the astigmatism coil/lens and/or the deflection coil/lens, which results in interference or cross-talk between these coils, resulting in incorrect electron beam position and thus a poor-quality three-dimensional article.

One known attempt to prevent the magnetic flux interaction with the surrounding environment is to apply a high permeability soft iron sleeve adjacent the electromagnetic focus coil. This attempt however, is not appropriate or feasible as the time-varying magnetic field produces eddy currents in the soft iron sleeve. The induced eddy currents in turn generate its own magnetic field which disturbs the scanning speed of the electron beam.

For this reason there is a need within the EBM field to further improve electron beam control and performance, and especially there is a need to find a solution where the magnetic flux originating from the electromagnetic focus coil can be blocked without disturbing the electron beam performance.

SUMMARY

The present invention aims at obviating the aforementioned disadvantages and failings of previously known apparatus/machines for additive manufacturing of a three-dimensional article, and at providing an improved apparatus, which machine exhibits improved electron beam performance compared to conventional machines and reduced interference with surrounding environment. A primary object of the present invention is to provide an improved apparatus and method of the initially defined type wherein the magnetic flux originating from the electromagnetic focus coil is blocked/shielded from interfering with surrounding environment without disturbing the electron beam performance. It is another object of the present invention to provide an apparatus, which blocks external magnetic fields from reaching the second section of the chamber.

According to the invention at least the primary object is attained by means of the initially defined apparatus and method having the features defined in the independent claims. Preferred embodiments of the present invention are further defined in the dependent claims.

According to a first aspect of the present invention, there is provided an apparatus of the initially defined type, which is characterized in that the second section of the chamber further comprises a reflector coil arranged radially outside the electromagnetic focus coil, wherein the direction of windings of the reflector coil is opposite the direction of windings of the electromagnetic focus coil.

According to a second aspect of the present invention, there is provided a coil arrangement suitable for such an apparatus, wherein the coil arrangement comprises an electromagnetic focus coil and a reflector coil arranged radially outside the electromagnetic focus coil, wherein the direction of windings of the reflector coil is opposite the direction of windings of the electromagnetic focus coil, and wherein the electromagnetic focus coil and the reflector coil are suspended by means of a carrier made of insulating material.

According to a third aspect of the present invention, there is provided a method comprising the steps of: providing a computer model of the three-dimensional article, distributing a layer of powder material on a work table in the first section, directing an electron beam from the electron beam source provided in the second section over the work table to fuse in first selected locations according to the computer model to form a first cross section of the three-dimensional article, repeating the distributing and directing steps until the three dimensional article is fully formed, and during the directing steps supplying AC power to the electromagnetic focus coil and to a reflector coil arranged radially outside the electromagnetic focus coil, wherein the direction of windings of the reflector coil is opposite the direction of windings of the electromagnetic focus coil.

Thus, the present invention is based on the insight of generating an additional magnetic flux having opposite direction to the magnetic flux generated by the electromagnetic focus coil, the electromagnetic focus coil is shielded in a feasible way without drawbacks and the resulting magnetic flux is greatly reduced. Compared to prior art machines the inventive apparatus provides for a better electron beam performance, and less interference with surrounding environment.

According to an exemplary embodiment of the present invention, the distance in the radial direction between the outer surface of the electromagnetic focus coil and the inner surface of the reflector coil is equal to or more than 0.14 times the outer diameter of the electromagnetic focus coil and equal to or less than 0.22 times the outer diameter of the electromagnetic focus coil. An exemplary advantage of at least this feature is that the resulting magnetic flux is minimized without having negative effect on the electron beam performance.

According to an exemplary embodiment of the present invention, the apparatus further comprises a drive current amplifier operatively connected to the electromagnetic focus coil and to the reflector coil in series with each other. An exemplary advantage of at least this feature is that the apparatus is simple and that the new reflector coil uses the existing drive current amplifier.

According to an exemplary embodiment of the present invention, the second section of the chamber further comprises an upper trim coil located between the electromagnetic focus coil and the electron beam source and a lower trim coil located between the electromagnetic focus coil and the first section of the chamber, wherein the direction of windings of the upper trim coil and the lower trim coil are the same and opposite the direction of windings of the electromagnetic focus coil. An exemplary advantage of at least this feature is that the interference between the electromagnetic focus coil and the astigmatism coil and the deflection coil, respectively, is minimized without having negative effect on the electron beam performance.

According to an exemplary embodiment of the present invention, the second section is defined by an electron beam housing, an outer shielding cover being arranged radially outside the electron beam housing. Preferably the axial extension of the outer shielding cover is equal to or more than 4 times the axial extension of the electromagnetic focus coil and equal to or less than 9 times the axial extension of the electromagnetic focus coil. An exemplary advantage of at least this feature is that external magnetic fields are blocked from reaching the second section of the chamber.

Further advantages with and features of the invention will be apparent from the other dependent claims as well as from the following detailed description of preferred embodiments.

BRIEF DESCRIPTION OF THE DRAWINGS

With reference to the appended drawings, below follows a more detailed description of embodiments of the invention cited as examples.

In the drawings.

DETAILED DESCRIPTION OF EXAMPLE EMBODIMENTS

Various embodiments of the present invention will now be described more fully hereinafter with reference to the accompanying drawings, in which some, but not all embodiments of the invention are shown. Indeed, embodiments of the invention may be embodied in many different forms and should not be construed as limited to the embodiments set forth herein. Rather, these embodiments are provided so that this disclosure will satisfy applicable legal requirements. Unless otherwise defined, all technical and scientific terms used herein have the same meaning as commonly known and understood by one of ordinary skill in the art to which the invention relates. The term "or" is used herein in both the alternative and conjunctive sense, unless otherwise indicated. Like numbers refer to like elements throughout.

Still further, to facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

The term "three-dimensional structures" and the like as used herein refer generally to intended or actually fabricated three-dimensional configurations (e.g., of structural material or materials) that are intended to be used for a particular purpose. Such structures, etc. may, for example, be designed with the aid of a three-dimensional CAD system.

The term "electron beam" as used herein in various embodiments refers to any charged particle beam. The sources of charged particle beam can include an electron gun, a linear accelerator and so on.

Figure 1:
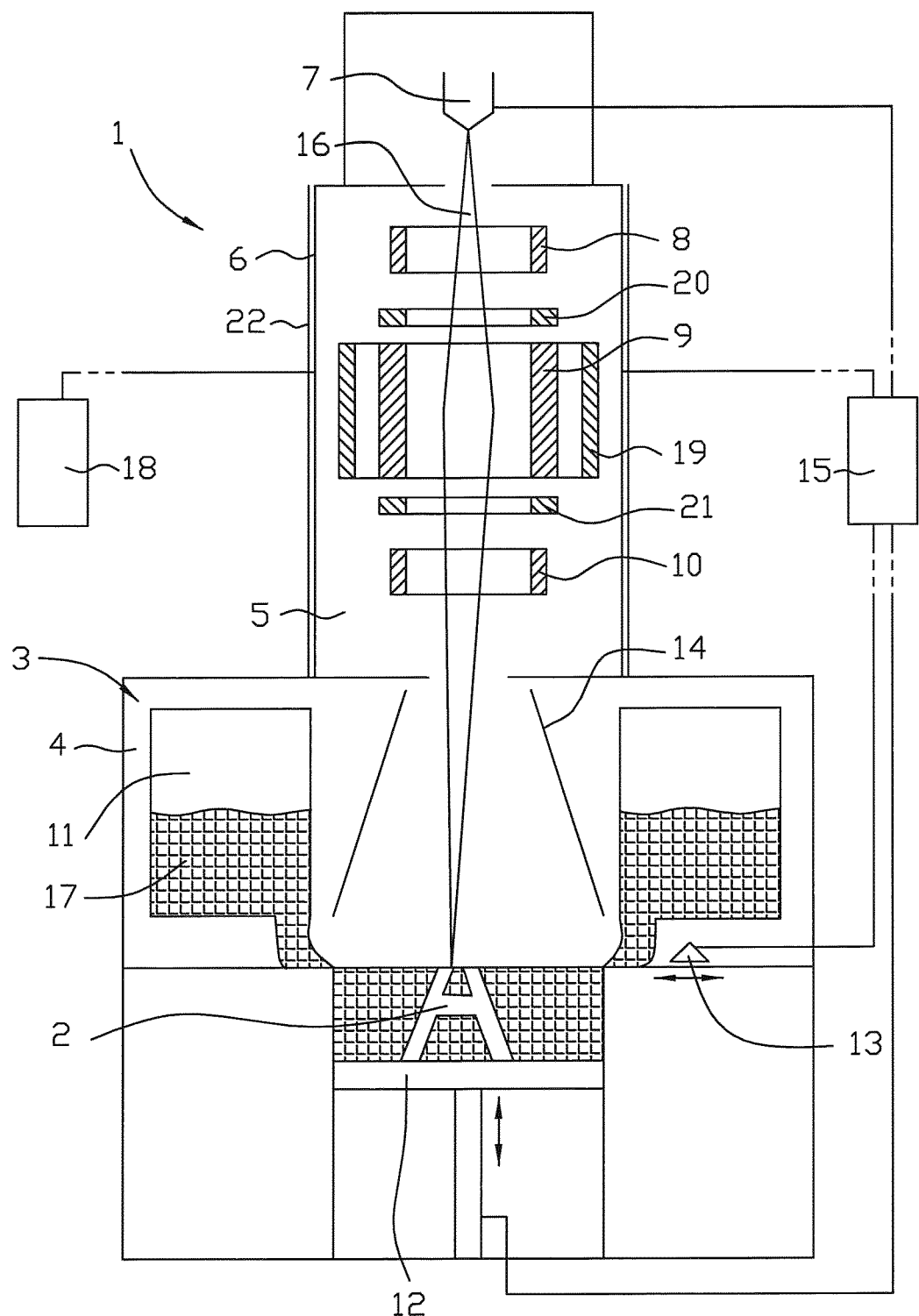
FIG. 1 is a schematic cross sectional side view of an electron beam melting (EBM) machine.

Reference is initially made to FIG. 1 disclosing a schematic illustration of an exemplary embodiment of a freeform fabrication apparatus or additive manufacturing apparatus 1, i.e. an electron beam melting machine (EBM), in which the present invention is implemented. Such apparatus 1 is intended for forming a three-dimensional article 2 through successively depositing individual layers of powder material that are fused together so as to form the article 2 according to a computer model thereof.

The apparatus 1 comprises a chamber 3 having a first section 4 and a second section 5 openly connected to each other, wherein the second section 5 is delimited by an electron beam housing 6. The electronic beam housing 6 and its contents is jointly known as electron beam unit (EBU). The three-dimensional article 2 is formed in the first section 4.

In accordance with prior art apparatus, the second section 5 of the disclosed embodiment of the inventive apparatus 1 comprises, i.e. the contents of the electronic beam housing 6 is constituted by, an electron beam source 7, an astigmatism coil/lens 8, an electromagnetic focus coil/lens 9 and a deflection coil/lens 10, distributed successively along an axial direction of the apparatus 1. All coils/lenses located in the second section 5 are jointly named beam steering and shaping optics. The electromagnetic focus coil 9 is an air core coil, and the astigmatism coil 8 and the deflector coil 10 comprises soft iron cores.

In accordance with prior art apparatus, the first section 4 of the disclosed embodiment of the inventive apparatus 1 comprises at least one powder hopper 11, a work table 12, a powder rake or distributor 13 and a heat shield 14.

In accordance with prior art apparatus, the disclosed embodiment of the inventive apparatus 1 comprises a control unit 15. The control unit 15 comprises a computer program product, in which information is stored concerning consecutive cross sections of the three-dimensional article 2, and instructions to control the apparatus 1 to form the three-dimensional article 2 through consecutive fusions of consecutively formed cross sections. The control unit 15 is operatively connected to at least the electron beam source 7, the beam steering and shaping optics, the powder rake 13 and the work table 12.

Now the general operation of a prior art apparatus and the inventive apparatus 1 will be explained.

The electron beam source 7 is configured to generate an electron beam 16 which is used for pre heating, melting or fusing together powder material 17 provided on the work table 12 or post heat treatment of the already fused article 2. The control unit 15 is configured for controlling and managing the electron beam 16 emitted from the electron beam source 7 by means of the beam steering and shaping optics, wherein the astigmatism coil 8 and the electromagnetic focus coil 9 are principally used for shaping the electron beam 16 and wherein the deflection coil 10 is principally used for steering the electron beam 16. In an example embodiment of the invention the electron beam source 7 may generate a focusable electron beam 16 with variable accelerating voltage of about 5-100 kV and with a beam power in the range of 2-15 kW. The powder hoppers 11 comprise the powder material 17 to be provided on the work table or build platform 12. The powder material 17 may for instance be pure metals or metal alloys such as titanium, titanium alloys, aluminum, aluminum alloys, stainless steel, Co—Cr alloys, nickel based super alloys, etc.

The powder rake 13 is arranged to distribute a thin layer of the powder material 17 on the work table 12. During a manufacturing cycle the work table 12 will be lowered successively in relation to a fixed point in the first section 4 of the chamber 3. In order to make this movement possible, the work table 12 is arranged movably in vertical direction, i.e. in the axial direction of the apparatus 1. This means that the work table 12 starts in an initial position, wherein a first powder material layer of appropriate and predetermined thickness is distributed. Means for lowering the work table 12 may for instance be through a servo engine equipped with a gear, adjusting screws, etc.

The electron beam 16 is directed/moved over the work table 12 causing the first powder layer to fuse in selected locations to form a first cross section of the three-dimensional article 2. The electron beam 16 is directed over the work table 12 by means of the beam steering and shaping optics from instructions given by the control unit 15. The first layer of the three-dimensional article 2 may be built directly on the work table 12, on top of a powder bed provided on the work table 12 or on a start plate, wherein the start plate may be arranged directly on the work table 12 or on top of a powder bed provided on the work table 12.

After a first layer is finished, i.e. the fusion of powder material 17 for making a first layer of the three-dimensional article 2, a second powder layer is provided on the work table 12. The thickness of the successive powder layers is determined by the distance the work table 12 is lowered in relation to the position where the preceding layer was built. After having distributed the second powder layer on the work table 12, the electron beam 16 is directed over the work table causing the second powder layer to fuse in selected locations to form a second cross section of the three-dimensional article 2. Fused portions in the second layer may be bonded to fused portions of the first layer. The fused portions in the first and second layer may be melted together by melting not only the powder in the uppermost layer but also re-melting at least a fraction of a thickness of a layer directly below the uppermost layer.

The powder 17 may be allowed to be slightly sintered during a pre-heating process. The pre-heating process is taking place before the actual fusing of the powder material in order to create a predetermined cross section of the three-dimensional article 2. The preheating may be performed in order to increase the conductivity of the powder material and/or to increase the working temperature of the powder material to be within a predetermined temperature range.

The essential features, preferred features and optional features of the present invention will now be disclosed. The present invention is primarily based on active shielding of the electromagnetic focus coil 9.

Figure 2:
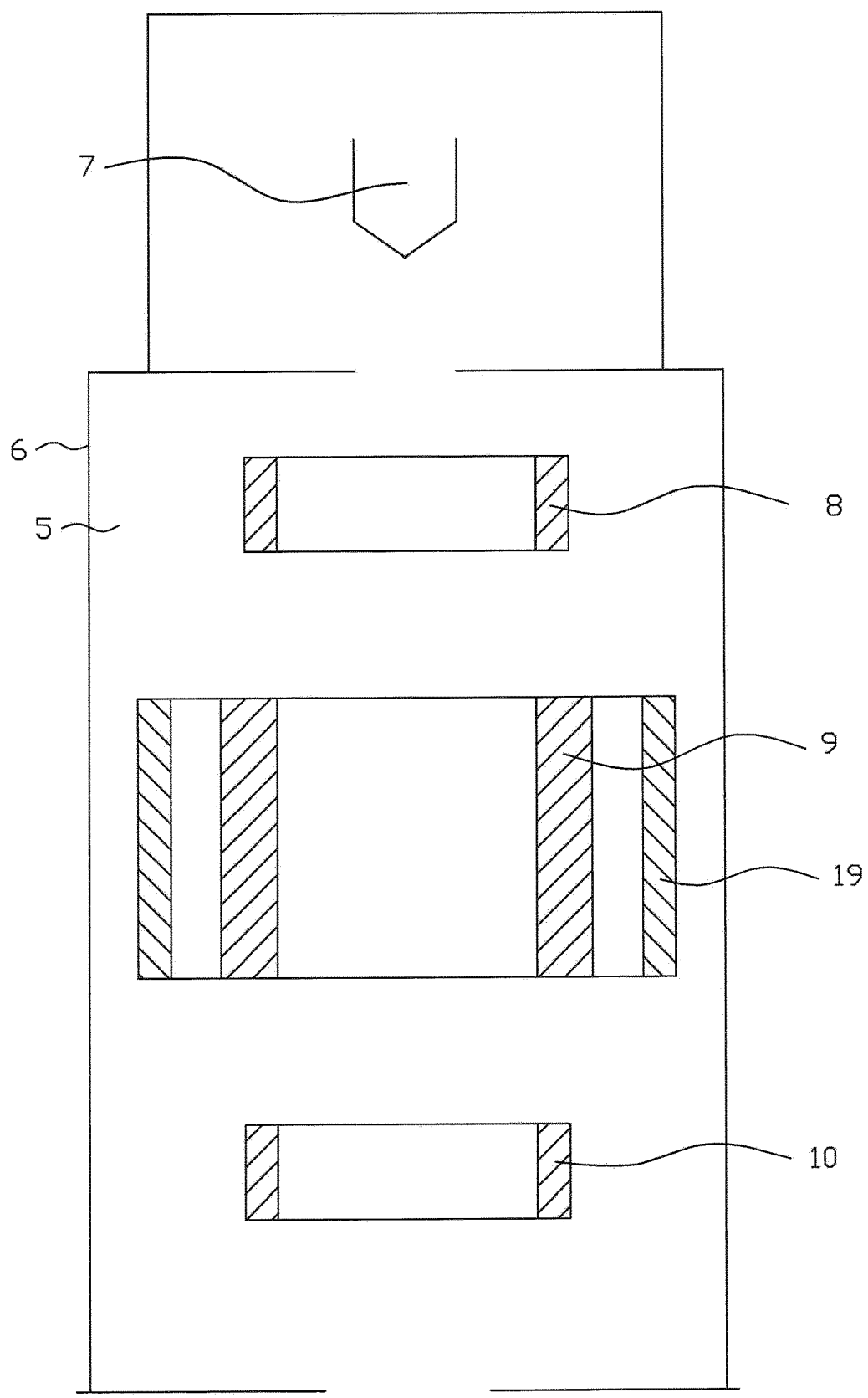
FIG. 2 is a schematic cross sectional side view of an electron beam unit (EBU) comprising a two-coil embodiment of the active shielding.

Reference is initially made to FIG. 2 disclosing a so-called two-coil embodiment of the active shielding of the present invention.

The electromagnetic focus coil 9 has an axially extending center axis, vertical in FIG. 2, and has a direction of winding in a first direction resulting in an alternating magnetic field when supplied with a drive current from a drive current amplifier 18 to obtain appropriate focus/defocus of the electron beam 16. Thereto, the inventive apparatus 1 comprises a reflector coil 19 arranged radially outside the electromagnetic focus coil 9, wherein the direction of winding of the reflector coil 19 is opposite the direction of windings of the electromagnetic focus coil 9, resulting in a magnetic field when supplied with a drive current from the amplifier 18 that is opposite to the magnetic field from the electromagnetic focus coil 9. The reflector coil 19 can be longer than the electromagnetic focus coil 9. Preferably, the reflector coil 19 is concentric with the electromagnetic focus coil 9. The reflector coil 19 is located in the second section 5 of the chamber 3, i.e. between the electromagnetic focus coil 9 and the electron beam housing 6. The reflector coil 9 is an air core coil.

It is preferred to use the same amplifier 18 for both the electromagnetic focus coil 9 and the reflector coil 19 in order to obtain a simpler and cheaper apparatus 1. The reflector coil 19 and the electromagnetic focus coil 9 are connected in series with each other and to the joint amplifier 18. The drive current is equal to or more than 2.0 Ampere and equal to or less than 3.0 Ampere. It shall be pointed out that the reflector coil 19 must not necessarily be connected in series with the electromagnetic focus coil 9 and/or must not receive drive current from the same amplifier 18. Thus, the reflector coil 19 and the electromagnetic focus coil 9 may be connected in parallel with each other. However, in such realizations the drive current and other dimensional parameters to focus the electron beam 16 have to be adjusted appropriately to still obtain the requested shielding effect and without having negative effect on the electron beam performance.

Figure 3:
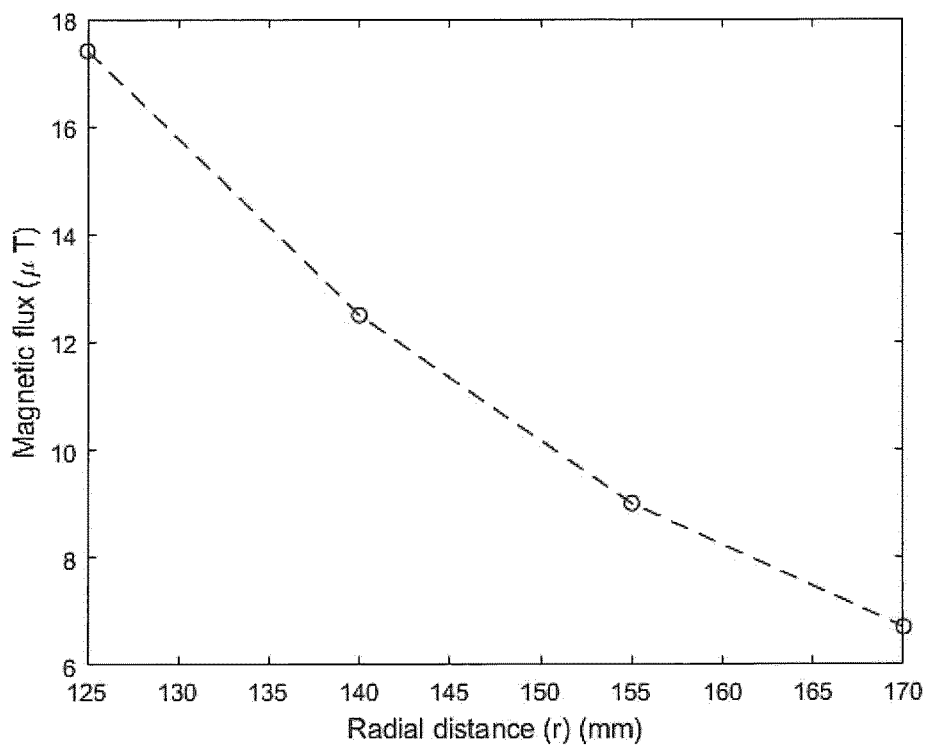
FIG. 3 is an exemplary graph disclosing the resulting magnetic flux from the electromagnetic focus coil in the radial direction without a reflector coil.
Figure 4:
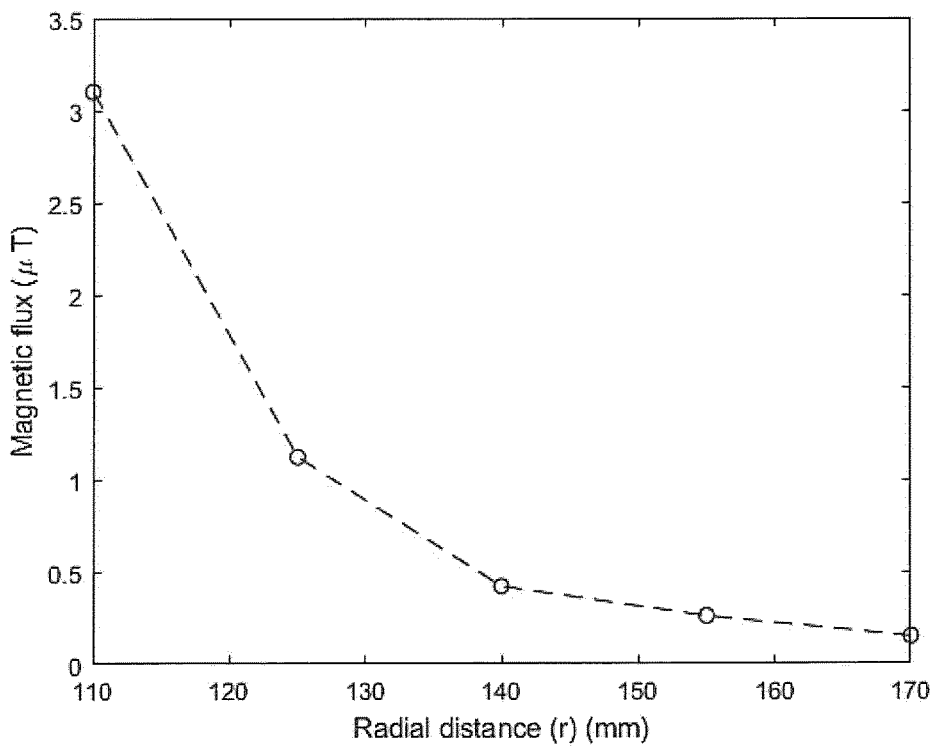
FIG. 4 is an exemplary graph corresponding to FIG. 5 and disclosing the resulting magnetic flux from the electromagnetic focus coil in the radial direction with a reflector coil.
Figure 5:
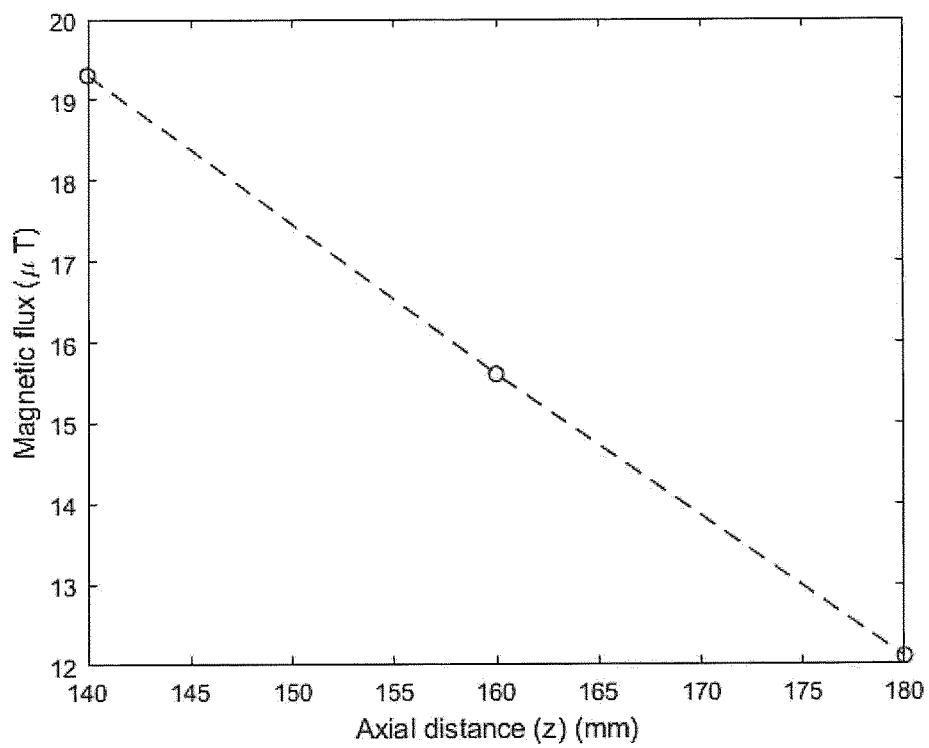
FIG. 5 is an exemplary graph disclosing the resulting magnetic flux from the electromagnetic focus coil in the axial direction without a reflector coil.
Figure 6:
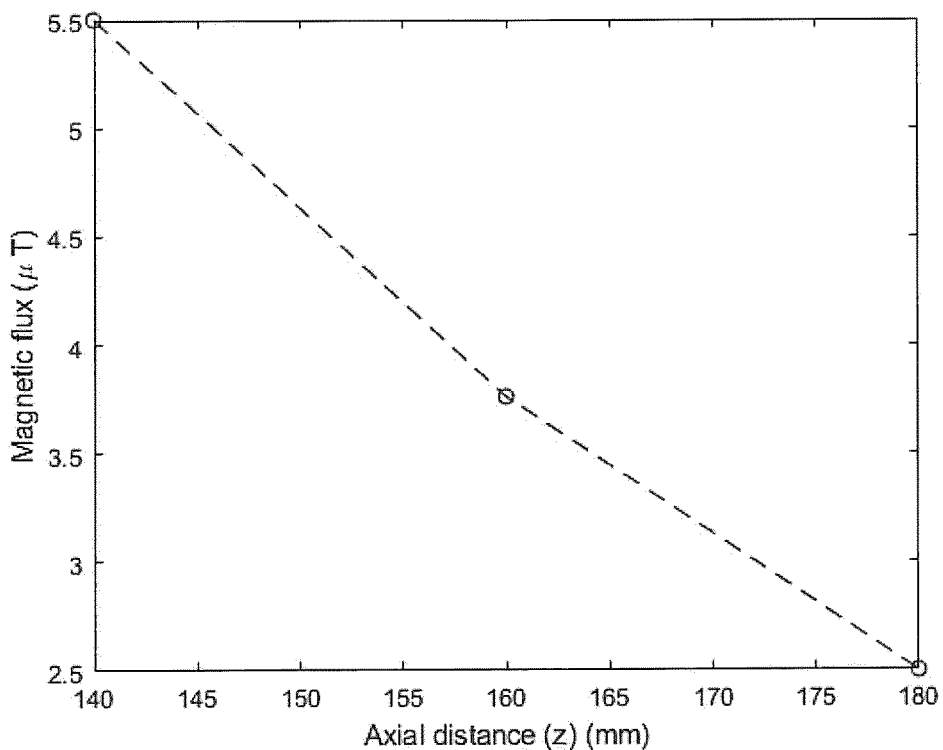
FIG. 6 is an exemplary graph corresponding to FIG. 7 and disclosing the resulting magnetic flux from the electromagnetic focus coil in the axial direction with a reflector coil.

Reference is now made to FIG. 3 disclosing the magnetic flux (μT) in the radial direction as a function of radius/distance (mm) from the axially extending center axis without use of a reflector coil, FIG. 4 disclosing the magnetic flux (μT) in the radial direction as a function of radius/distance (mm) from the axially extending center axis using a reflector coil 19, FIG. 5 disclosing the magnetic flux (μT) in the axial direction as a function of distance (mm) from the middle of the electromagnetic focus coil 9 without use of a reflector coil, and FIG. 6 disclosing the magnetic flux (μT) in the axial direction as a function of distance (mm) from the middle of the electromagnetic focus coil 9 using a reflector coil 19. As can be seen in FIGS. 3-6, the resulting magnetic flux is decreased considerably when using a reflector coil 19.

In the test example, the number of turns of the electromagnetic focus coil 9 is 120, the inner diameter of the electromagnetic focus coil 9 is 34 mm, the outer diameter of the electromagnetic focus coil 9 is 50 mm, the axial height of the electromagnetic focus coil 9 is 24 mm, the number of turns of the reflector coil 19 is 30, the inner diameter of the reflector coil 19 is 66 mm, the outer diameter of the reflector coil 19 is 72 mm, and the axial height of the reflector coil 19 is 24 mm. The electromagnetic focus coil 9 and the reflector coil 19 are located at the same level in the electron beam housing 6.

According to an exemplary embodiment of the invention the distance in the radial direction between the outer surface of the electromagnetic focus coil 9 and the inner surface of the reflector coil 19 is equal to or more than 0.14 times the outer diameter of the electromagnetic focus coil 9 and equal to or less than 0.24 times the outer diameter of the electromagnetic focus coil 19 and optimized at 0.16 times the outer diameter of the electromagnetic focus coil 19.

According to the two-coil embodiment disclosed in FIG. 2. The outer diameter of the electromagnetic focus coil 9 is equal to or more than 46 mm and equal to or less than 54 mm, most preferably equal to or more than 48 mm and equal to or less than 52 mm, and optimized at 50 mm. The inner diameter of the reflector coil 19 is equal to or more than 60 mm and equal to or less than 78 mm, most preferably equal to or more than 62 mm and equal to or less than 76 mm, and optimized at 66 mm. The optimized inner diameter of the electromagnetic focus coil 9 is 34 mm. The outer diameter of the reflector coil 19 is equal to or more than 64 mm and equal to or less than 84 mm, most preferably equal to or more than 68 mm and equal to or less than 82 mm, and optimized at 72 mm. Best shielding is obtained using the optimized values.

According to an exemplary embodiment of the invention the axial extension of the reflector coil 19 is equal to or more than 0.9 times the axial extension of the electromagnetic focus coil 9 and equal to or less than 1.1 times the axial extension of the electromagnetic focus coil 9. Most preferably the axial height of the reflector coil 19 and the axial height of the electromagnetic focus coil 9 is the same. According to the embodiment disclosed in FIG. 2, the optimized axial height of the electromagnetic focus coil 9 is 24 mm. Best shielding is obtained using the optimized values.

According to an exemplary embodiment of the invention the number of turns of the reflector coil 19 is equal to or more than 0.16 times the number of turns of the electromagnetic focus coil 9 and equal to or less than 0.33 times the number of turns of the electromagnetic focus coil 9.

According to the two-coil embodiment disclosed in FIG. 2. The number of turns of the electromagnetic focus coil 9 is equal to or more than 100 and equal to or less than 160, most preferably equal to or more than 110 and equal to or less than 140, and optimized at 120. The number of turns of the reflector coil 19 is equal to or more than 20 and equal to or less than 40, most preferably equal to or more than 25 and equal to or less than 35 and optimized at 30. Best shielding is obtained using the optimized values.

Figure 7:
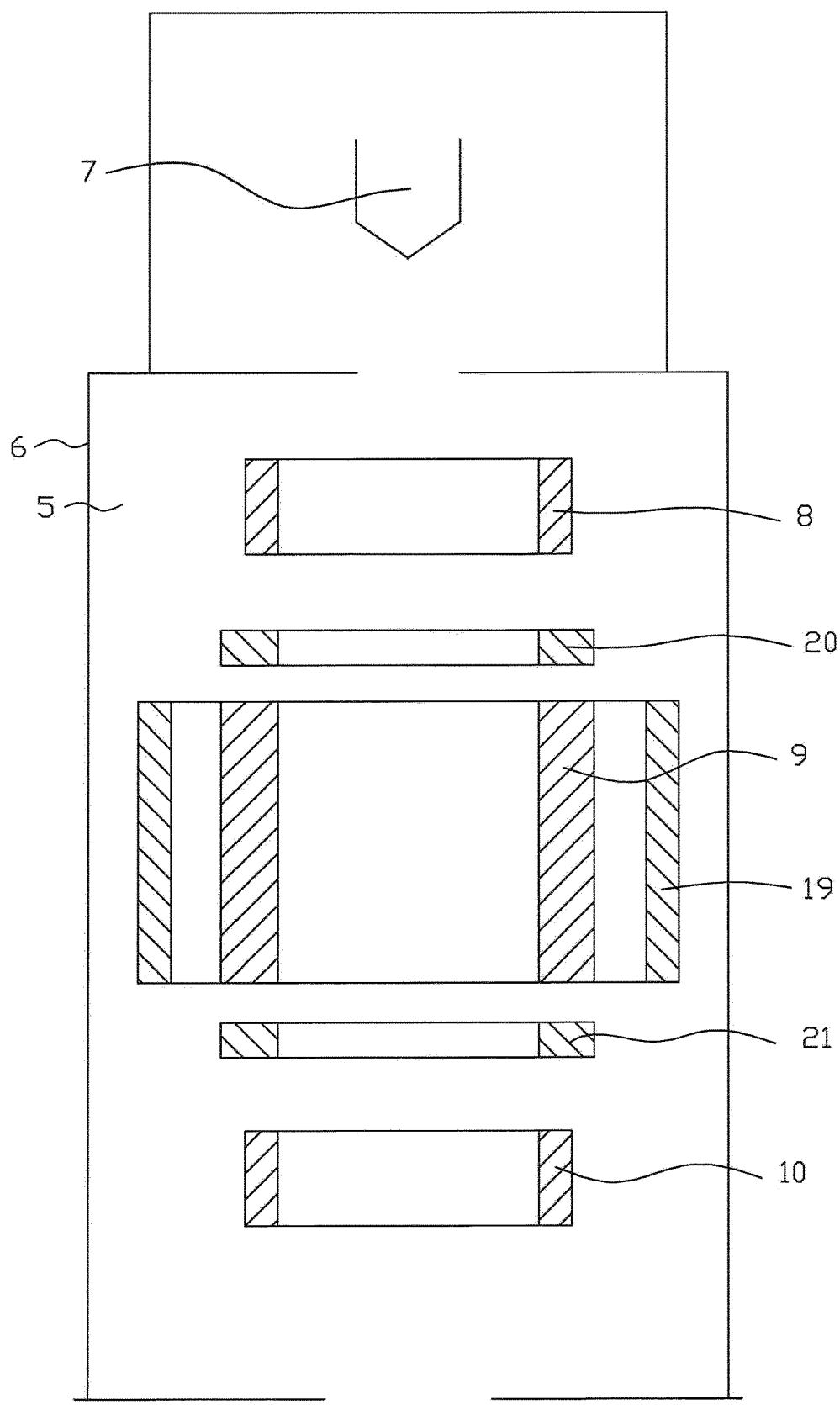
FIG. 7 is a schematic cross sectional side view of an electron beam unit (EBU) comprising a four-coil embodiment of the active shielding.

Reference is now made to FIG. 7 disclosing a so-called four-coil embodiment of the active shielding of the present invention. In addition to the two-coil embodiment disclosed in FIG. 2, the apparatus 1 furthermore comprises an upper trim coil 20 located between the electromagnetic focus coil 9 and the electron beam source 7 and a lower trim coil 21 located between the electromagnetic focus coil 9 and the first section 4 of the chamber 3. The upper trim coil 20 and the lower trim coil 21 will further decrease the interference between the electromagnetic focus coil 9 and the astigmatism coil 8 and the deflection coil 10, respectively.

The direction of winding of the upper trim coil 20 and the direction of winding of the lower trim coil 21 are the same and opposite the direction of windings of the electromagnetic focus coil 9, resulting in an alternating magnetic field when supplied with a drive current from the drive current amplifier 18 that is opposite the resulting alternating magnetic field from the electromagnetic focus coil 9. Preferably, the upper trim coil 20 and the lower trim coil 21 are concentric with the electromagnetic focus coil 9. The upper trim coil 20 and the lower trim coil 21 are located in the second section 5 of the chamber 3. According to the preferred embodiment the upper trim coil 20 is located between the electromagnetic focus coil 9 and the astigmatism coil 8, and the lower trim coil 21 is located between the electromagnetic focus coil 9 and the deflection coil 10. The upper trim coil 20 and the lower trim coil 21 are air core coils.

It is preferred to use the same amplifier 18 for all coils in order to obtain a simpler and cheaper apparatus 1. The upper trim coil 20 and the lower trim coil 21 and the electromagnetic focus coil 9 are connected in series with each other and to the joint amplifier 18. It shall be pointed out that the upper trim coil 20 and the lower trim coil 21 must not necessarily be connected in series with the electromagnetic focus coil 9 and/or having a drive current from the same amplifier 18. Thus, the upper trim coil 20, the lower trim coil 21 and the electromagnetic focus coil 9 may be connected in parallel with each other. However, in such realizations the drive current and other dimensional parameters to focus the electron beam 16 have to be adjusted appropriately to still obtain the requested shielding effect and without having negative effect on the electron beam performance.

According to an exemplary embodiment of the invention the distance in the axial direction between the lower trim coil 21 and the upper trim coil 20 is equal to or more than 1.16 times the axial extension of the electromagnetic focus coil 9 and equal to or less than 1.41 times the axial extension of the electromagnetic focus coil 9. Preferably the distance in the axial direction between the electromagnetic focus coil 9 and the upper trim coil 20 is equal to the distance in the axial direction between the electromagnetic focus coil 9 and the lower trim coil 21.

According to an exemplary embodiment of the invention the number of turns of the upper trim coil 20 and the number of turns of the lower trim coil 21, respectively, is equal to or more than 0.04 times the number of turns of the electromagnetic focus coil 9 and equal to or less than 0.14 times the number of turns of the electromagnetic focus coil 9 and optimized at 0.07 times the number of turns of the electromagnetic focus coil 9.

According to the four-coil embodiment disclosed in FIG. 7. The outer diameter of the electromagnetic focus coil 9 is equal to or more than 50 mm and equal to or less than 56 mm, most preferably equal to or more than 51 mm and equal to or less than 53 mm, and optimized at 52 mm. The inner diameter of the reflector coil 19 is equal to or more than 60 mm and equal to or less than 78 mm, most preferably equal to or less than 73 mm, and optimized at 70 mm. The optimized inner diameter of the electromagnetic focus coil 9 is 34 mm. The outer diameter of the reflector coil 19 is equal to or more than 64 mm and equal to or less than 84 mm, most preferably equal to or less than 78 mm, and optimized at 76 mm. The optimized axial height of the electromagnetic focus coil 9 is 24 mm. The outer diameter of the upper trim coil 20 and the lower trim coil 21 is equal to or more than 32 mm and equal to or less than 44 mm, most preferably equal to or more than 33 mm and equal to or less than 38 mm, and optimized at 36 mm. Best shielding is obtained using the optimized values.

The distance in the axial direction between the lower trim coil 21 and the upper trim coil 20 is equal to or more than 28 mm and equal to or less than 34 mm. The optimized inner diameter of the upper trim coil 20 and the lower trim coil 21 is 30 mm. Best shielding is obtained using the optimized values.

The number of turns of the electromagnetic focus coil 9 is equal to or more than 120 and equal to or less than 180, most preferably equal to or more than 130 and equal to or less than 150, and optimized at 140. The number of turns of the reflector coil 19 is equal to or more than 20 and equal to or less than 40, most preferably equal to or more than 25, and optimized at 30. The number of turns of the upper trim coil 20 and the lower trim coil 21 is equal to or more than 5 and equal to or less than 20, most preferably equal to or less than 15, and optimized at 10. Best shielding is obtained using the optimized values.

Reference is now made to FIG. 1, wherein the apparatus 1 also comprises a passive shielding of the beam steering and shaping optics in addition to the four-coil embodiment according to FIG. 7. Thus, the passive shielding blocks any resulting magnetic flux from the beam steering and shaping optics and also blocks any external magnetic flux, such as from the earth and surrounding equipment, from reaching into the electron beam housing 6.

According to the disclosed embodiment an outer shielding cover 22 is arranged radially outside the electron beam housing 6. Preferably, the axial extension of the outer shielding cover 22 is equal to or more than 4 times the axial extension of the electromagnetic focus coil 9 and equal to or less than 9 times the axial extension of the electromagnetic focus coil 9. The axial extension of the outer shielding cover 22 is equal to or more than 250 mm and equal to or less than 500 mm. Preferably the thickness of the outer shielding cover 22 is equal to or more than 0.2 mm and equal to or less than 1 mm. The outer shielding cover 22 is constituted by a soft ferromagnetic alloy having a relative magnetic permeability equal to or more than 70 000, such as a nickel-iron ferromagnetic alloy, for instance Mu-metal. The outer shielding cover 22 may comprise a plurality of layers, seen in the radial direction.

As a complement or as an alternative to the outer shielding cover 22 to increase the magnetic flux blocking effect, an inner shielding lining having the same characteristics as the outer shielding cover 22 may be arranged radially inside the electron beam housing 6 and radially outside the reflector coil 19.

One of the advantages of the invention is that neighboring electron beam melting machines may be located closer to each other, and thereto an individual electron beam melting machine may comprise several electron beam units.

Figure 8:
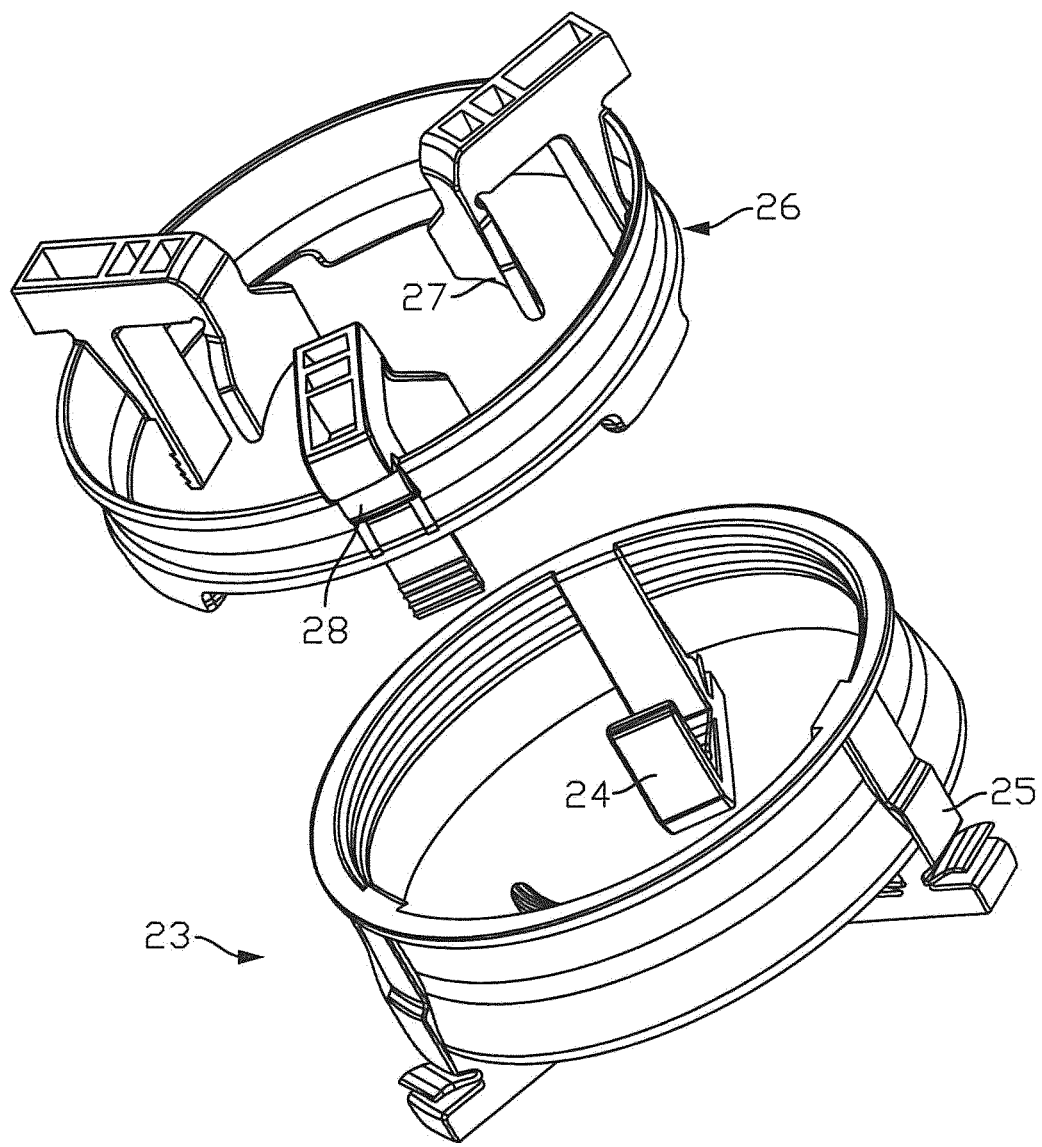
FIG. 8 is a schematic perspective view of a carrier for suspending the electromagnetic focus coil and the reflector coil.
Figure 9:
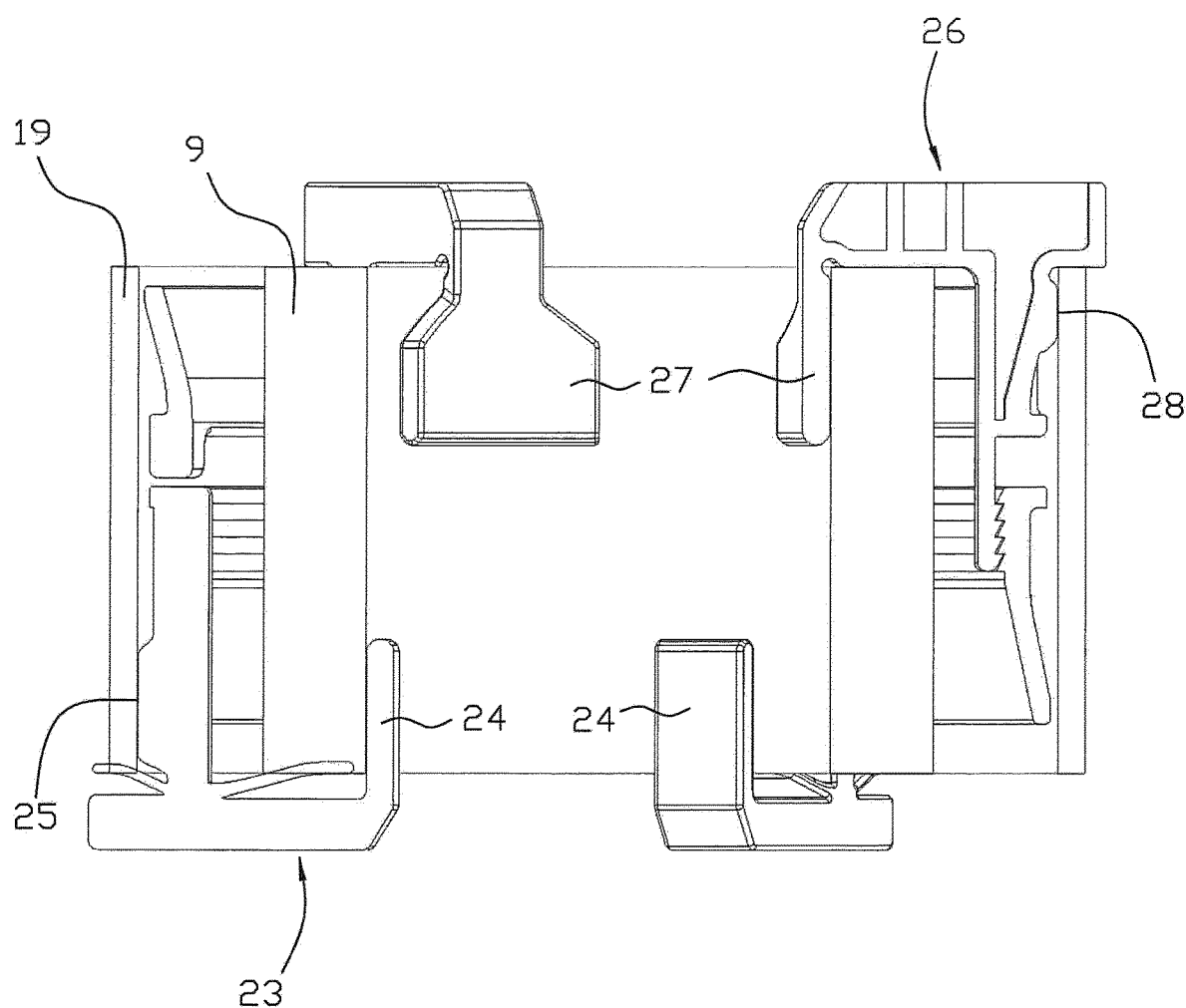
FIG. 9 is a schematic cross sectional side view of the carrier, the electromagnetic focus coil and the reflector coil.

Reference is now made to FIGS. 8 and 9, disclosing an exemplary embodiment of a means for suspending the electromagnetic focus coil 9 and the reflector coil 19 in the electron beam housing 6, i.e. a coil arrangement suitable for a disclosed apparatus for additive manufacturing of a three-dimensional article, wherein the means for suspending comprises a carrier 23 made of an insulating material, such as plastics. The lower rims of the electromagnetic focus coil 9 and the reflector coil 19 are standing on supports on the carrier 23.

Thereto, the carrier 23 comprises a first set of positioning elements 24 abutting the inner surface of the electromagnetic focus coil 9, such that the electromagnetic focus coil 9 is centered, and a second set of positioning elements 25 abutting the inner surface of the reflector coil 19, such that the reflector coil 19 is centered. Each element of the first set of positioning elements 24 is preferably located along the same radius as one of the elements of the second set of positioning elements 25. The elements of the first set of positioning elements 24 and the elements of the second set of positioning elements 25, respectively, are preferably equidistantly distributed. The first set of positioning elements 24 and the second set of positioning elements 25, respectively, comprise preferably three individual elements.

Thereto, the means for suspending may comprise an assistant carrier 26 arranged to abut the upper rims of the electromagnetic focus coil 9 and the reflector coil 19, to secure that the coils are locked in position. The assistant carrier 26 and the carrier 23 are releasably connected to each other, preferably by means of snap connection. The assistant carrier 26 and the carrier 23 may be turned in relation to each other when connected to each other, at least a part of one revolution, preferably up to 100 degrees.

The assistant carrier 26 may comprise a first set of positioning elements 27 abutting the inner surface of the electromagnetic focus coil 9, such that the electromagnetic focus coil 9 is centered, and a second set of positioning elements 28 abutting the inner surface of the reflector coil 19, such that the reflector coil 19 is centered. Each element of the first set of positioning elements 27 is preferably located along the same radius as one of the elements of the second set of positioning elements 28. The elements of the first set of positioning elements 27 and the elements of the second set of positioning elements 28, respectively, are preferably equidistantly distributed. The first set of positioning elements 27 and the second set of positioning elements 28, respectively, comprise preferably three individual elements.

As mentioned, various embodiments of the present invention may be implemented in various ways, including as computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, and/or similar terms used herein interchangeably). Such non-transitory computer-readable storage media include all computer-readable media (including volatile and non-volatile media).

In one embodiment, a non-volatile computer-readable storage medium may include a floppy disk, flexible disk, hard disk, solid-state storage (SSS) (e.g., a solid state drive (SSD), solid state card (SSC), solid state module (SSM)), enterprise flash drive, magnetic tape, or any other non-transitory magnetic medium, and/or the like. A non-volatile computer-readable storage medium may also include a punch card, paper tape, optical mark sheet (or any other physical medium with patterns of holes or other optically recognizable indicia), compact disc read only memory (CD-ROM), compact disc compact disc-rewritable (CD-RW), digital versatile disc (DVD), Blu-ray disc (BD), any other non-transitory optical medium, and/or the like. Such a non-volatile computer-readable storage medium may also include read-only memory (ROM), programmable read-only memory (PROM), erasable programmable read-only memory (EPROM), electrically erasable programmable read-only memory (EEPROM), flash memory (e.g., Serial, NAND, NOR, and/or the like), multimedia memory cards (MMC), secure digital (SD) memory cards, SmartMedia cards, CompactFlash (CF) cards, Memory Sticks, and/or the like. Further, a non-volatile computer-readable storage medium may also include conductive-bridging random access memory (CBRAM), phase-change random access memory (PRAM), ferroelectric random-access memory (FeRAM), non-volatile random-access memory (NVRAM), magnetoresistive random-access memory (MRAM), resistive random-access memory (RRAM), Silicon-Oxide-Nitride-Oxide-Silicon memory (SONOS), floating junction gate random access memory (FJG RAM), Millipede memory, racetrack memory, and/or the like.

In one embodiment, a volatile computer-readable storage medium may include random access memory (RAM), dynamic random access memory (DRAM), static random access memory (SRAM), fast page mode dynamic random access memory (FPM DRAM), extended data-out dynamic random access memory (EDO DRAM), synchronous dynamic random access memory (SDRAM), double data rate synchronous dynamic random access memory (DDR SDRAM), double data rate type two synchronous dynamic random access memory (DDR2 SDRAM), double data rate type three synchronous dynamic random access memory (DDR3 SDRAM), Rambus dynamic random access memory (RDRAM), Twin Transistor RAM (TTRAM), Thyristor RAM (T-RAM), Zero-capacitor (Z-RAM), Rambus in-line memory module (RIMM), dual in-line memory module (DIMM), single in-line memory module (SIMM), video random access memory VRAM, cache memory (including various levels), flash memory, register memory, and/or the like. It will be appreciated that where embodiments are described to use a computer-readable storage medium, other types of computer-readable storage media may be substituted for or used in addition to the computer-readable storage media described above.

As should be appreciated, various embodiments of the present invention may also be implemented as methods, apparatus, systems, computing devices, computing entities, and/or the like, as have been described elsewhere herein. As such, embodiments of the present invention may take the form of an apparatus, system, computing device, computing entity, and/or the like executing instructions stored on a computer-readable storage medium to perform certain steps or operations. However, embodiments of the present invention may also take the form of an entirely hardware embodiment performing certain steps or operations.

Various embodiments are described below with reference to block diagrams and flowchart illustrations of apparatuses, methods, systems, and computer program products. It should be understood that each block of any of the block diagrams and flowchart illustrations, respectively, may be implemented in part by computer program instructions, e.g., as logical steps or operations executing on a processor in a computing system. These computer program instructions may be loaded onto a computer, such as a special purpose computer or other programmable data processing apparatus to produce a specifically-configured machine, such that the instructions which execute on the computer or other programmable data processing apparatus implement the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the functionality specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide operations for implementing the functions specified in the flowchart block or blocks.

Accordingly, blocks of the block diagrams and flowchart illustrations support various combinations for performing the specified functions, combinations of operations for performing the specified functions and program instructions for performing the specified functions. It should also be understood that each block of the block diagrams and flowchart illustrations, and combinations of blocks in the block diagrams and flowchart illustrations, could be implemented by special purpose hardware-based computer systems that perform the specified functions or operations, or combinations of special purpose hardware and computer instructions.

Figure 10:
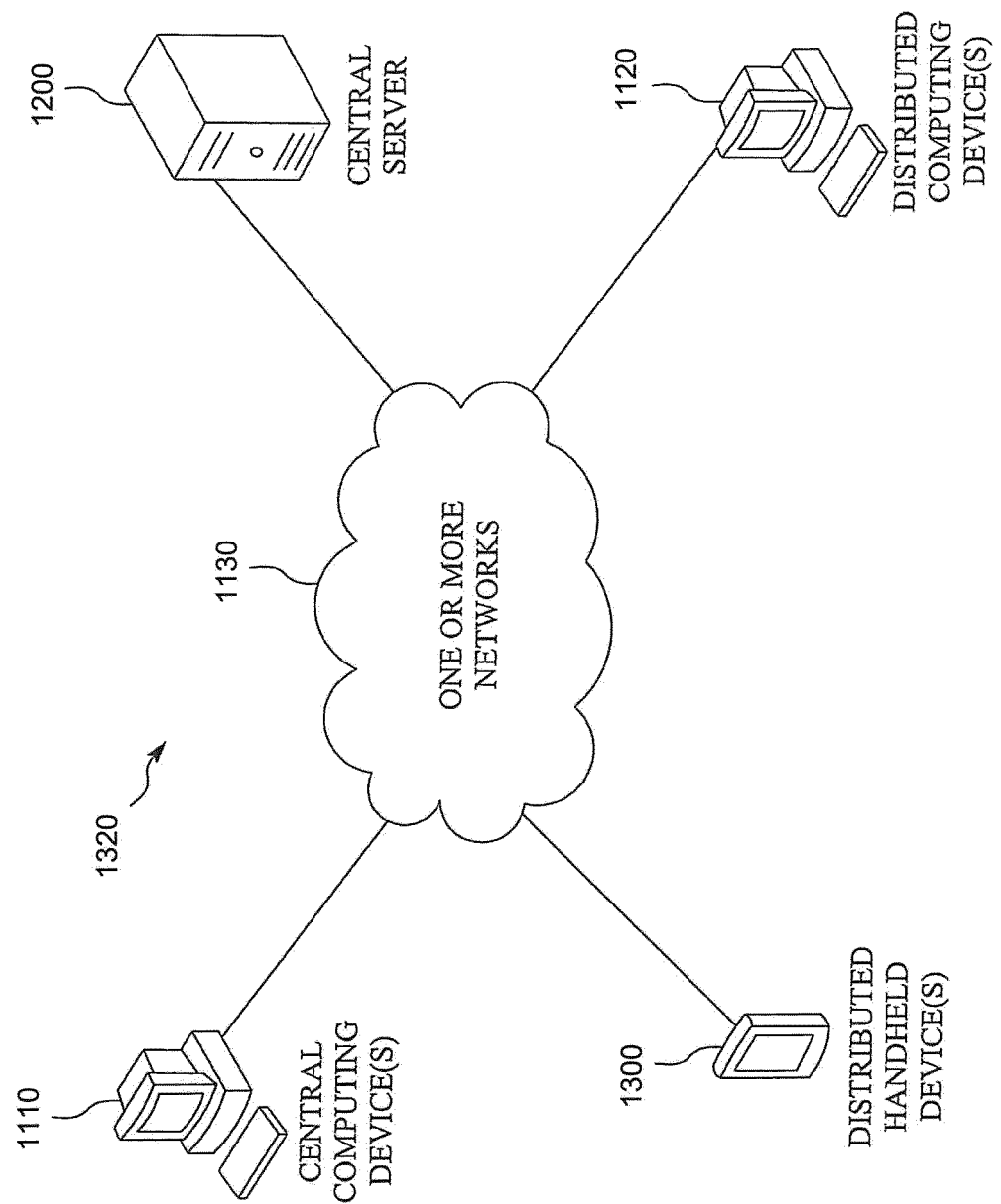
FIG. 10 is a block diagram of an exemplary system according to various embodiments.

FIG. 10 is a block diagram of an exemplary system 1320 that can be used in conjunction with various embodiments of the present invention. In at least the illustrated embodiment, the system 1320 may include one or more central computing devices 1110, one or more distributed computing devices 1120, and one or more distributed handheld or mobile devices 1300, all configured in communication with a central server 1200 (or control unit) via one or more networks 1130. While FIG. 10 illustrates the various system entities as separate, standalone entities, the various embodiments are not limited to this particular architecture.

According to various embodiments of the present invention, the one or more networks 1130 may be capable of supporting communication in accordance with any one or more of a number of second-generation (2G), 2.5G, third-generation (3G), and/or fourth-generation (4G) mobile communication protocols, or the like. More particularly, the one or more networks 130 may be capable of supporting communication in accordance with 2G wireless communication protocols IS-136 (TDMA), GSM, and IS-95 (CDMA). Also, for example, the one or more networks 1130 may be capable of supporting communication in accordance with 2.5G wireless communication protocols GPRS, Enhanced Data GSM Environment (EDGE), or the like. In addition, for example, the one or more networks 130 may be capable of supporting communication in accordance with 3G wireless communication protocols such as Universal Mobile Telephone System (UMTS) network employing Wideband Code Division Multiple Access (WCDMA) radio access technology. Some narrow-band AMPS (NAMPS), as well as TACS, network(s) may also benefit from embodiments of the present invention, as should dual or higher mode mobile stations (e.g., digital/analog or TDMA/CDMA/analog phones). As yet another example, each of the components of the system 1320 may be configured to communicate with one another in accordance with techniques such as, for example, radio frequency (RF), Bluetooth™, infrared (IrDA), or any of a number of different wired or wireless networking techniques, including a wired or wireless Personal Area Network ("PAN"), Local Area Network ("LAN"), Metropolitan Area Network ("MAN"), Wide Area Network ("WAN"), or the like.

Although the device(s) 1110-3100 are illustrated in FIG. 10 as communicating with one another over the same network 1130, these devices may likewise communicate over multiple, separate networks.

According to one embodiment, in addition to receiving data from the server 1200, the distributed devices 1110, 1120, and/or 1300 may be further configured to collect and transmit data on their own. In various embodiments, the devices 1110, 1120, and/or 1300 may be capable of receiving data via one or more input units or devices, such as a keypad, touchpad, barcode scanner, radio frequency identification (RFID) reader, interface card (e.g., modem, etc.) or receiver. The devices 1110, 1120, and/or 1300 may further be capable of storing data to one or more volatile or non-volatile memory modules, and outputting the data via one or more output units or devices, for example, by displaying data to the user operating the device, or by transmitting data, for example over the one or more networks 1130.

In various embodiments, the server 1200 includes various systems for performing one or more functions in accordance with various embodiments of the present invention, including those more particularly shown and described herein. It should be understood, however, that the server 1200 might include a variety of alternative devices for performing one or more like functions, without departing from the spirit and scope of the present invention. For example, at least a portion of the server 1200, in certain embodiments, may be located on the distributed device(s) 1110, 1120, and/or the handheld or mobile device(s) 1300, as may be desirable for particular applications. As will be described in further detail below, in at least one embodiment, the handheld or mobile device(s) 1300 may contain one or more mobile applications 1330 which may be configured so as to provide a user interface for communication with the server 1200, all as will be likewise described in further detail below.

Figure 11:
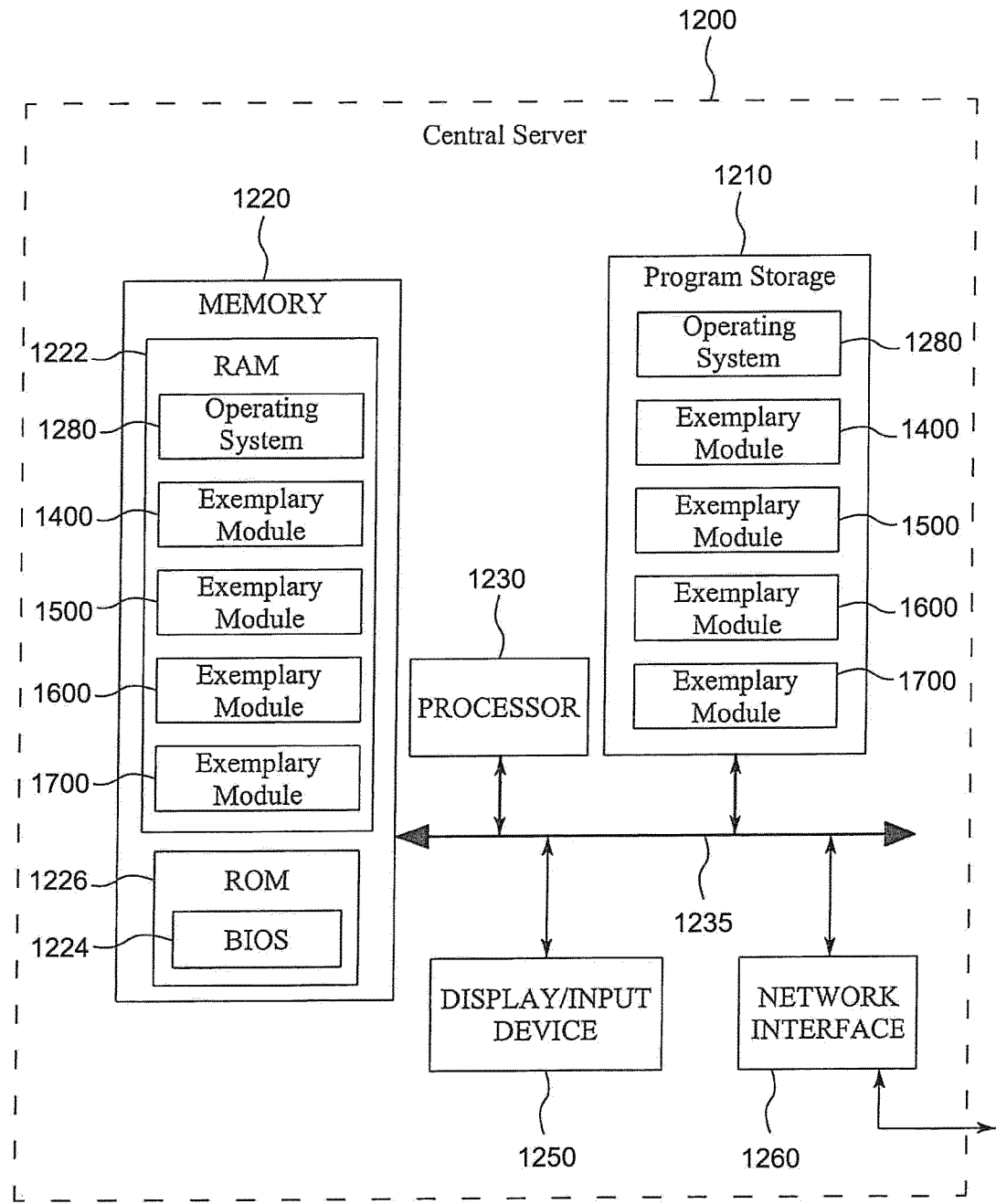
FIG. 11 is a schematic block diagram of an exemplary server according to various embodiments.

FIG. 11 is a schematic diagram of the server 1200 according to various embodiments. The server1 200 includes a processor 1230 that communicates with other elements within the server via a system interface or bus 1235. Also included in the server 1200 is a display/input device 1250 for receiving and displaying data. This display/input device 1250 may be, for example, a keyboard or pointing device that is used in combination with a monitor. The server 1200 further includes memory 1220, which typically includes both read only memory (ROM) 1226 and random access memory (RAM) 1222. The server's ROM 1226 is used to store a basic input/output system 1224 (BIOS), containing the basic routines that help to transfer information between elements within the server 1200. Various ROM and RAM configurations have been previously described herein.

In addition, the server 1200 includes at least one storage device or program storage 1210, such as a hard disk drive, a floppy disk drive, a CD Rom drive, or optical disk drive, for storing information on various computer-readable media, such as a hard disk, a removable magnetic disk, or a CD-ROM disk. As will be appreciated by one of ordinary skill in the art, each of these storage devices 1210 are connected to the system bus 1235 by an appropriate interface. The storage devices 1210 and their associated computer-readable media provide nonvolatile storage for a personal computer. As will be appreciated by one of ordinary skill in the art, the computer-readable media described above could be replaced by any other type of computer-readable media known in the art. Such media include, for example, magnetic cassettes, flash memory cards, digital video disks, and Bernoulli cartridges.

Although not shown, according to an embodiment, the storage device 1210 and/or memory of the server 1200 may further provide the functions of a data storage device, which may store historical and/or current delivery data and delivery conditions that may be accessed by the server 1200. In this regard, the storage device 1210 may comprise one or more databases. The term "database" refers to a structured collection of records or data that is stored in a computer system, such as via a relational database, hierarchical database, or network database and as such, should not be construed in a limiting fashion.

A number of program modules (e.g., exemplary modules 1400-1700) comprising, for example, one or more computer-readable program code portions executable by the processor 1230, may be stored by the various storage devices 1210 and within RAM 1222. Such program modules may also include an operating system 1280. In these and other embodiments, the various modules 1400, 1500, 1600, 1700 control certain aspects of the operation of the server 1200 with the assistance of the processor 1230 and operating system 1280. In still other embodiments, it should be understood that one or more additional and/or alternative modules may also be provided, without departing from the scope and nature of the present invention.

In various embodiments, the program modules 1400, 1500, 1600, 1700 are executed by the server 1200 and are configured to generate one or more graphical user interfaces, reports, instructions, and/or notifications/alerts, all accessible and/or transmittable to various users of the system 1320. In certain embodiments, the user interfaces, reports, instructions, and/or notifications/alerts may be accessible via one or more networks 1130, which may include the Internet or other feasible communications network, as previously discussed.

In various embodiments, it should also be understood that one or more of the modules 1400, 1500, 1600, 1700 may be alternatively and/or additionally (e.g., in duplicate) stored locally on one or more of the devices 1110, 1120, and/or 1300 and may be executed by one or more processors of the same. According to various embodiments, the modules 1400, 1500, 1600, 1700 may send data to, receive data from, and utilize data contained in one or more databases, which may be comprised of one or more separate, linked and/or networked databases.

Also located within the server 1200 is a network interface 1260 for interfacing and communicating with other elements of the one or more networks 1130. It will be appreciated by one of ordinary skill in the art that one or more of the server 1200 components may be located geographically remotely from other server components. Furthermore, one or more of the server 1200 components may be combined, and/or additional components performing functions described herein may also be included in the server.

While the foregoing describes a single processor 1230, as one of ordinary skill in the art will recognize, the server 1200 may comprise multiple processors operating in conjunction with one another to perform the functionality described herein. In addition to the memory 1220, the processor 1230 can also be connected to at least one interface or other means for displaying, transmitting and/or receiving data, content or the like. In this regard, the interface(s) can include at least one communication interface or other means for transmitting and/or receiving data, content or the like, as well as at least one user interface that can include a display and/or a user input interface, as will be described in further detail below. The user input interface, in turn, can comprise any of a number of devices allowing the entity to receive data from a user, such as a keypad, a touch display, a joystick or other input device.

Still further, while reference is made to the "server" 1200, as one of ordinary skill in the art will recognize, embodiments of the present invention are not limited to traditionally defined server architectures. Still further, the system of embodiments of the present invention is not limited to a single server, or similar network entity or mainframe computer system. Other similar architectures including one or more network entities operating in conjunction with one another to provide the functionality described herein may likewise be used without departing from the spirit and scope of embodiments of the present invention. For example, a mesh network of two or more personal computers (PCs), similar electronic devices, or handheld portable devices, collaborating with one another to provide the functionality described herein in association with the server 200 may likewise be used without departing from the spirit and scope of embodiments of the present invention.

According to various embodiments, many individual steps of a process may or may not be carried out utilizing the computer systems and/or servers described herein, and the degree of computer implementation may vary, as may be desirable and/or beneficial for one or more particular applications.

Figure 12:
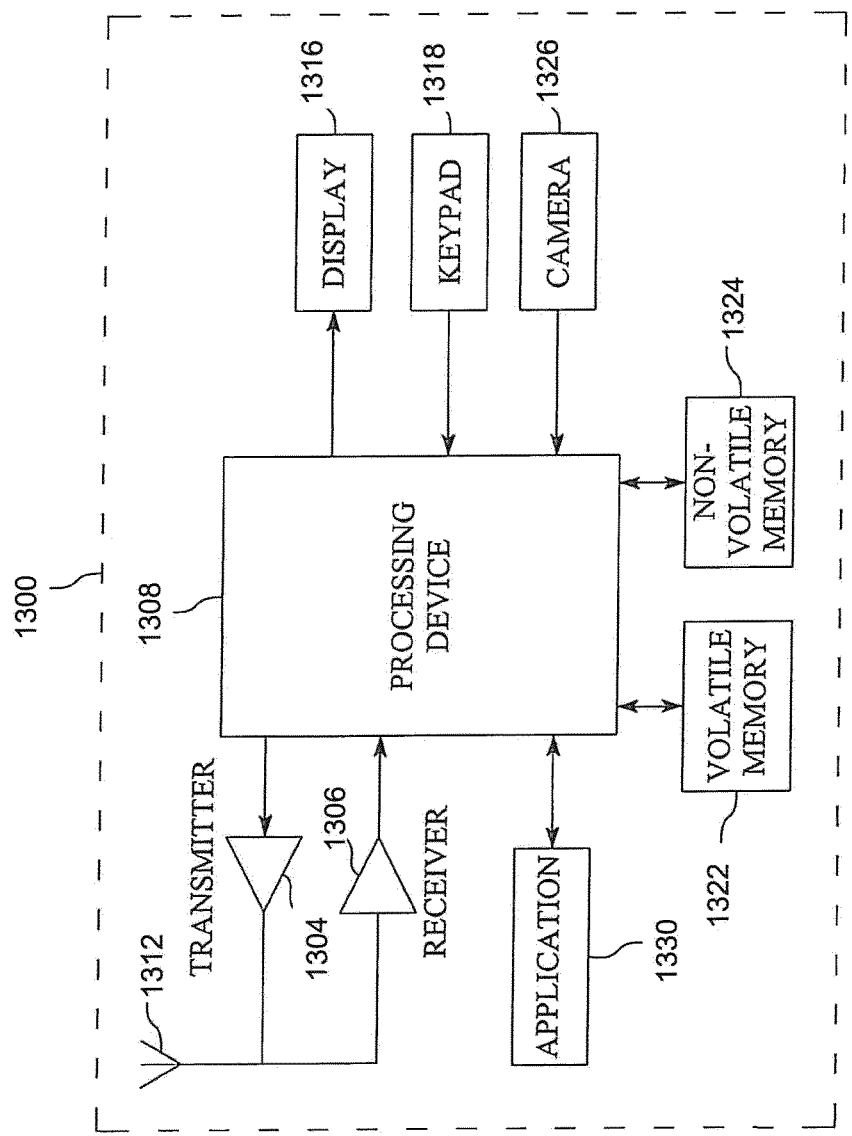
FIG. 12 is a schematic block diagram of an exemplary mobile device according to various embodiments.

FIG. 12 provides an illustrative schematic representative of a mobile device 1300 that can be used in conjunction with various embodiments of the present invention. Mobile devices 1300 can be operated by various parties. As shown in FIG. 12, a mobile device 1300 may include an antenna 1312, a transmitter 1304 (e.g., radio), a receiver 1306 (e.g., radio), and a processing element 1308 that provides signals to and receives signals from the transmitter 1304 and receiver 1306, respectively.

The signals provided to and received from the transmitter 1304 and the receiver 1306, respectively, may include signaling data in accordance with an air interface standard of applicable wireless systems to communicate with various entities, such as the server 1200, the distributed devices 1110, 1120, and/or the like. In this regard, the mobile device 1300 may be capable of operating with one or more air interface standards, communication protocols, modulation types, and access types. More particularly, the mobile device 1300 may operate in accordance with any of a number of wireless communication standards and protocols. In a particular embodiment, the mobile device 1300 may operate in accordance with multiple wireless communication standards and protocols, such as GPRS, UMTS, CDMA2000, 1×RTT, WCDMA, TD-SCDMA, LTE, E-UTRAN, EVDO, HSPA, HSDPA, Wi-Fi, WiMAX, UWB, IR protocols, Bluetooth protocols, USB protocols, and/or any other wireless protocol.

Via these communication standards and protocols, the mobile device 1300 may according to various embodiments communicate with various other entities using concepts such as Unstructured Supplementary Service data (USSD), Short Message Service (SMS), Multimedia Messaging Service (MMS), Dual-Tone Multi-Frequency Signaling (DTMF), and/or Subscriber Identity Module Dialer (SIM dialer). The mobile device 300 can also download changes, add-ons, and updates, for instance, to its firmware, software (e.g., including executable instructions, applications, program modules), and operating system.

According to one embodiment, the mobile device 1300 may include a location determining device and/or functionality. For example, the mobile device 1300 may include a GPS module adapted to acquire, for example, latitude, longitude, altitude, geocode, course, and/or speed data. In one embodiment, the GPS module acquires data, sometimes known as ephemeris data, by identifying the number of satellites in view and the relative positions of those satellites.

The mobile device 1300 may also comprise a user interface (that can include a display 1316 coupled to a processing element 1308) and/or a user input interface (coupled to a processing element 1308). The user input interface can comprise any of a number of devices allowing the mobile device 300 to receive data, such as a keypad 1318 (hard or soft), a touch display, voice or motion interfaces, or other input device. In embodiments including a keypad 1318, the keypad can include (or cause display of) the conventional numeric (0-9) and related keys (#, *), and other keys used for operating the mobile device 1300 and may include a full set of alphabetic keys or set of keys that may be activated to provide a full set of alphanumeric keys. In addition to providing input, the user input interface can be used, for example, to activate or deactivate certain functions, such as screen savers and/or sleep modes.

The mobile device 1300 can also include volatile storage or memory 1322 and/or non-volatile storage or memory 1324, which can be embedded and/or may be removable. For example, the non-volatile memory may be ROM, PROM, EPROM, EEPROM, flash memory, MMCs, SD memory cards, Memory Sticks, CBRAM, PRAM, FeRAM, RRAM, SONOS, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. The volatile and non-volatile storage or memory can store databases, database instances, database mapping systems, data, applications, programs, program modules, scripts, source code, object code, byte code, compiled code, interpreted code, machine code, executable instructions, and/or the like to implement the functions of the mobile device 1300.

The mobile device 1300 may also include one or more of a camera 1326 and a mobile application 1330. The camera 1326 may be configured according to various embodiments as an additional and/or alternative data collection feature, whereby one or more items may be read, stored, and/or transmitted by the mobile device 1300 via the camera. The mobile application 1330 may further provide a feature via which various tasks may be performed with the mobile device 1300. Various configurations may be provided, as may be desirable for one or more users of the mobile device 1300 and the system 1320 as a whole.

The invention is not limited only to the embodiments described above and shown in the drawings, which primarily have an illustrative and exemplifying purpose. This patent application is intended to cover all adjustments and variants of the preferred embodiments described herein, thus the present invention is defined by the wording of the appended claims and the equivalents thereof. Thus, the equipment may be modified in all kinds of ways within the scope of the appended claims.

It shall also be pointed out that all information about/ concerning terms such as above, under, upper, lower, etc., shall be interpreted/read having the equipment oriented according to the figures, having the drawings oriented such that the references can be properly read. Thus, such terms only indicates mutual relations in the shown embodiments, which relations may be changed if the inventive equipment is provided with another structure/design.

It shall also be pointed out that even thus it is not explicitly stated that features from a specific embodiment may be combined with features from another embodiment, the combination shall be considered obvious, if the combination is possible.

Throughout this specification and the claims which follows, unless the context requires otherwise, the word "comprise", and variations such as "comprises" or "comprising", will be understood to imply the inclusion of a stated integer or steps or group of integers or steps but not the exclusion of any other integer or step or group of integers or steps.

The invention claimed is:

1. An apparatus for forming a three-dimensional article through successively depositing individual layers of powder material that are fused together, the apparatus comprising:
a chamber having a first section and a second section openly connected to each other, the first section configured to receive the individual layers of powder material that are fused together, the second section comprising an electron beam source, an electromagnetic focus coil having an axially extending, and a reflector coil, wherein the electron beam source is configured to emit an electron beam to fuse the individual layers of powder material;
wherein the reflector coil is arranged radially outside the electromagnetic focus coil between the electromagnetic focus coil and an electron beam housing, wherein a direction of windings of the reflector coil is opposite a direction of windings of the electromagnetic focus coil.

2. The apparatus according to claim 1, wherein the reflector coil is concentric with the electromagnetic focus coil, and wherein the electromagnetic focus coil and the reflector coil are air core coils.

3. The apparatus according to claim 1, wherein a distance in a radial direction between an outer surface of the electromagnetic focus coil and an inner surface of the reflector coil is equal to or more than 0.14 times an outer diameter of the electromagnetic focus coil and equal to or less than 0.22 times the outer diameter of the electromagnetic focus coil.

4. The apparatus according to claim 1, wherein an axial extension of the reflector coil is equal to or more than 0.9 times an axial extension of the electromagnetic focus coil and equal to or less than 1.1 times the axial extension of the electromagnetic focus coil.

5. The apparatus according to claim 1, wherein a number of turns of the reflector coil is equal to or more than 0.21 times a number of turns of the electromagnetic focus coil and equal to or less than 0.32 times the number of turns of the electromagnetic focus coil.

6. The apparatus according to claim 1, wherein the reflector coil and the electromagnetic focus coil are at least one of connected in series with each other or connected in parallel with each other.

7. The apparatus according to claim 1, wherein the apparatus further comprises a drive current amplifier (18) operatively connected to the electromagnetic focus coil and to the reflector coil.

8. The apparatus according to claim 1, wherein the second section of the chamber further comprises an upper trim coil located between the electromagnetic focus coil and the electron beam source and a lower trim coil located between the electromagnetic focus coil and the first section of the chamber, wherein of the upper trim coil and the lower trim coil are the same direction as each other and opposite the direction of windings of the electromagnetic focus coil.

9. The apparatus according to claim 8, wherein the upper trim coil, the lower trim coil and the electromagnetic focus coil are at least one of connected in series with each other or connected in parallel with each other.

10. The apparatus according to claim 8, wherein a distance in an axial direction between the lower trim coil and the upper trim coil is equal to or more than 1.16 times the axial extension of the electromagnetic focus coil and equal to or less than 1.41 times the axial extension of the electromagnetic focus coil.

11. The apparatus according to claim 8, wherein a number of turns of the upper trim coil and a number of turns of the lower trim coil, respectively, are equal to or more than 0.04 times a number of turns of the electromagnetic focus coil and equal to or less than 0.16 times the number of turns of the electromagnetic focus coil.

12. The apparatus according to claim 1, wherein the second section is defined by an electron beam housing and an outer shielding cover being arranged radially outside the electron beam housing.

13. The apparatus according to claim 12, wherein an axial extension of the outer shielding cover is equal to or more than 4 times an axial extension of the electromagnetic focus coil and equal to or less than 9 times the axial extension of the electromagnetic focus coil.

14. The apparatus according to claim 13, wherein a thickness of the outer shielding cover is equal to or more than 0.2 millimeters, and equal to or less than 1 millimeters.

15. The apparatus according to claim 1, wherein the electromagnetic focus coil and the reflector coil are suspended within the second section by a carrier comprising insulating material;
wherein the carrier comprises a first set of positioning elements abutting an inner surface of the electromagnetic focus coil and a second set of positioning elements abutting an inner surface of the reflector coil.

16. An apparatus for forming a three-dimensional article through successively depositing individual layers of powder material that are fused together, the apparatus comprising:
an electromagnetic focus coil having an axially extending center axis, and
a reflector coil arranged radially outside the electromagnetic focus coil, wherein a direction of windings of the reflector coil is opposite a direction of windings of the electromagnetic focus coil, and wherein the electromagnetic focus coil and the reflector coil are suspended by a carrier comprising insulating material.

17. The apparatus according to claim 16, wherein the carrier comprises a first set of positioning elements abutting an inner surface of the electromagnetic focus coil and a second set of positioning elements abutting an inner surface of the reflector coil.

18. The apparatus according to claim 16, further comprising an assistant carrier arranged to abut an upper rim of the electromagnetic focus coil and an upper rim the reflector coil.

19. A method for operating an additive manufacturing apparatus in which a three-dimensional article is formed through successively depositing individual layers of powder material that are fused together according to a computer model so as to form the three-dimensional article, the method comprising the steps of:
providing the computer model as a model of the three-dimensional article;
distributing a layer of powder material on a work table in a first section of an apparatus comprising a chamber comprising the first section and a second section openly connected to each other, the second section comprising an electron beam source and an electromagnetic focus coil having an axially extending central axis;
directing an electron beam from the electron beam source over the work table to fuse in first selected locations according to the computer model to form a first cross section of the three-dimensional article, such that drive current is supplied to the electromagnetic focus coil and to a reflector coil arranged radially outside the electromagnetic focus coil between the electromagnetic focus coil and an electron beam housing, and wherein a direction of windings of the reflector coil is opposite a direction of windings of the electromagnetic focus coil; and
repeating the distributing and directing steps until the three-dimensional article is formed.

20. The method according to claim 19, wherein the drive current is equal to or more than 2.0 Ampere and equal to or less than 3.0 Ampere.

* * * * *